US012777813B2

(12) United States Patent
Zhang et al.

(10) Patent No.: US 12,777,813 B2
(45) Date of Patent: Oct. 27, 2026

(54) SHORT CIRCUIT PROTECTION FOR ORGANIC ELECTROLUMINESCENT DEVICE

(71) Applicant: GU AN YEOLIGHT TECHNOLOGY CO., LTD., Guan County (CN)

(72) Inventors: Guohui Zhang, Guan County (CN); Yingguang Zhu, Guan County (CN); Tianxing Lu, Guan County (CN); Yanbo Dong, Guan County (CN); Yonglan Hu, Guan County (CN); Jing Xie, Guan County (CN)

(73) Assignee: GU AN YEOLIGHT TECHNOLOGY CO., LTD., Guan County (CN)

( * ) Notice: Subject to any disclaimer, the term of this patent is extended or adjusted under 35 U.S.C. 154(b) by 368 days.

(21) Appl. No.: 18/290,010

(22) PCT Filed: May 30, 2022

(86) PCT No.: PCT/CN2022/095963
§ 371 (c)(1),
(2) Date: Nov. 8, 2023

(87) PCT Pub. No.: WO2022/253180
PCT Pub. Date: Dec. 8, 2022

(65) Prior Publication Data

US 2024/0260393 A1 Aug. 1, 2024

(30) Foreign Application Priority Data

Jun. 1, 2021 (CN) ......................... 202110607640.9

(51) Int. Cl.
*H10K 59/80* (2023.01)
*H10K 50/813* (2023.01)
(Continued)

(52) U.S. Cl.
CPC ..... *H10K 59/80515* (2023.02); *H10K 50/813* (2023.02); *H10K 50/814* (2023.02); *H10K 59/80516* (2023.02); *H10K 2102/341* (2023.02)

(58) Field of Classification Search
CPC ............... H10K 50/813; H10K 50/814; H10K 59/80515; H10K 59/80516; H10K 2102/314
See application file for complete search history.

(56) References Cited

U.S. PATENT DOCUMENTS

| | | | | |
|---|---|---|---|---|
| 9,666,830 | B2 * | 5/2017 | Lee | H10K 59/84 |
| 9,793,333 | B2 * | 10/2017 | Lee | H10K 50/814 |

(Continued)

FOREIGN PATENT DOCUMENTS

| | | | |
|---|---|---|---|
| CN | 104145349 | A | 11/2014 |
| CN | 104982092 | A | 10/2015 |

(Continued)

OTHER PUBLICATIONS

Extended European Search Report dated Feb. 7, 2025, issued by the European Patent Office in connection with European Patent Application No. 22815225.2 (10 pages).

(Continued)

*Primary Examiner* — Daniel Luke
(74) *Attorney, Agent, or Firm* — McCarter & English, LLP

(57) ABSTRACT

Provided is an organic electroluminescent device. The organic electroluminescent device includes a substrate, an auxiliary electrode disposed on the substrate, multiple tree-shaped transparent electrodes disposed on the substrate, an insulating layer covering the auxiliary electrode and the tree-shaped transparent electrodes, an anti-short-circuit electrode layer disposed on the insulating layer, a second elec- (Continued)

trode layer disposed opposite to the anti-short-circuit electrode layer, and an organic functional layer disposed between the anti-short-circuit electrode layer and the second electrode layer. Each tree-shaped transparent electrode is disposed at a position corresponding to a luminescent region of the organic electroluminescent device and is electrically connected to the auxiliary electrode. At least one luminescent region is provided. In each luminescent region, the insulating layer is provided with multiple aperture regions, and an aperture region is disposed at a position corresponding to a tree-shaped transparent electrode.

20 Claims, 4 Drawing Sheets

(51) Int. Cl.

*H10K 50/814* (2023.01)

*H10K 102/00* (2023.01)

(56) References Cited

U.S. PATENT DOCUMENTS

| | | | |
|---|---|---|---|
| 9,825,249 B2* | 11/2017 | Lee | H10K 59/80516 |
| 10,325,975 B2* | 6/2019 | Moon | H10K 59/131 |
| 10,559,773 B2* | 2/2020 | Song | H10K 59/80516 |
| 2014/0332795 A1 | 11/2014 | Guimard et al. | |
| 2015/0160518 A1 | 6/2015 | Wang et al. | |
| 2017/0084863 A1 | 3/2017 | Kang et al. | |
| 2018/0145221 A1 | 5/2018 | Wu et al. | |
| 2019/0019990 A1 | 1/2019 | Song et al. | |
| 2019/0237695 A1* | 8/2019 | Shi | H10K 59/80522 |
| 2022/0158122 A1 | 5/2022 | Lu et al. | |

FOREIGN PATENT DOCUMENTS

| | | |
|---|---|---|
| CN | 105098014 A | 11/2015 |
| CN | 106463642 A | 2/2017 |
| CN | 106711341 A | 5/2017 |
| CN | 109244265 A | 1/2019 |
| CN | 109411618 A | 3/2019 |
| CN | 109888116 A | 6/2019 |
| CN | 110061036 A | 7/2019 |
| CN | 111564563 A | 8/2020 |
| CN | 112582567 A | 3/2021 |
| CN | 113346032 A | 9/2021 |
| JP | 2015144272 A | 8/2015 |
| WO | 2020/164554 A1 | 8/2020 |

OTHER PUBLICATIONS

Chinese Office Action dated Apr. 6, 2022, issued in connection with Chinese Patent Appl. 202110607640.9 (14 pages, including English translation).

English translation of the PCT International Search Report dated Aug. 18, 2022, in Int'l Application No. PCT/CN2022/095963 (3 pages).

* cited by examiner

SHORT CIRCUIT PROTECTION FOR ORGANIC ELECTROLUMINESCENT DEVICE

CROSS-REFERENCE TO RELATED APPLICATIONS

This is a National Stage Application, filed under 35 U.S.C. 371, of International Patent Application No. PCT/CN20222/095963, filed on May 30, 2022, which claims priority to Chinese Patent Application No. 202110607640.9 filed with the China National Intellectual Property Administration (CNIPA) on Jun. 1, 2021, the disclosures of which are incorporated herein by reference in their entireties.

TECHNICAL FIELD

The present disclosure relates to the technical field of organic electroluminescence, for example, an organic electroluminescent device.

BACKGROUND

Organic light-emitting diode (OLED) screens are widely used because of their features such as ultra-thinness, large area, high uniformity, and excellent heat dissipation performance. Because the total thickness of the organic layer of an OLED device is on the order of tens to hundreds of nanometers, the distance between the anode and cathode of the OLED is particularly small. During the preparation of OLED screens, however, defect points such as dust particles, burrs, pinholes, and cracks in the surrounding environment inevitably adhere to each layer of the OLEDs. These defect points cause direct contact between the anode and cathode, leading to a short circuit. All the current flows through the short-circuit point, generating a large amount of heat to cause OLED screens to fail in a manner of burning, ablation, and rupture.

There are three main schemes to prevent short circuits in the related art.

1. Surface resistance scheme: The entire surface of an oxide resistance layer is evaporated on an indium tin oxide (ITO) electrode. Since the thickness of the oxide resistance layer is far less than the height of particles, particles already exist on the ITO surface before oxide evaporation or sputtering, or particles are generated during oxide evaporation. In this case, short circuits cannot be prevented. Therefore, there is still a certain risk of short circuits.
2. Series resistance scheme: A luminescent region is divided into tiny luminescent regions in parallel, and a series resistance is arranged at the edge of each tiny luminescent region. When a pixel is completely short-circuited, a relatively large series resistance is required. In this design, on the one hand, the resistance occupies the luminescent region and reduces the aperture ratio of the luminescent region; while on the other hand, this scheme is only applicable to screens with a larger area and more partitions. For example, the luminescent region of 100*100 $mm^2$ is divided into 10000 1 mm*1 mm micro-partitions, each of which has a series resistance of 2000Ω. The overall driving voltage is 3.5V, and the overall driving current is 500 mA. When one of the pixels is short-circuited, the maximum current passing through the pixel is 3.5 V/2000Ω, which equals to 1.75 mA. Relative to the entire screen, 1.75 mA/500 mA=0.35%, which means only 0.35% of the current flows through the pixel. In this manner, the overall brightness of the screen is not affected. However, when the overall area of the luminescent region is relatively small, for example, 10*10 $mm^2$, the area of 10*10 $mm^2$ is divided into 100 1 mm*1 mm partitions. The corresponding driving voltage and current are 3.5 V and 5 mA respectively. If a short circuit occurs in one of the partitions, the loss current ratio is 1.75 mA/5 mA, which equals to 35%. In this case, the brightness of the screen drops by about 35%, failing to well prevent the short circuits. Moreover, since the current of adjacent pixels is concentrated toward the defect position, non-uniform light emission is easily caused.
3. Blowing Scheme:
   (1) A large current is required to blow the fuse. Before the blown current is reached, the defective pixel leaks a lot of current, resulting in non-uniform light emission.
   (2) This scheme is applicable to a light source having a large overall luminescent region and is not applicable to a light source having a small overall luminescent region.
   (3) In the blowing process, large amounts of heat are easily released, easily causing an overall failure of the screen.
   (4) After the blowing, a larger region does not emit light. Even caused by 1 $\mu m^2$ or 2 $\mu m^2$, the defects in practice are displayed in larger areas.

SUMMARY

The present disclosure provides an organic electroluminescent device that does not affect the aperture ratio of the device and has excellent anti-short-circuit performance.

The present application provides an organic electroluminescent device. The organic electroluminescent device includes a substrate, an auxiliary electrode disposed on the substrate, multiple tree-shaped transparent electrodes disposed on the substrate, an insulating layer, an anti-short-circuit electrode layer, a second electrode layer, and an organic functional layer.

Each of the multiple tree-shaped transparent electrodes is disposed at a position corresponding to a luminescent region of the organic electroluminescent device and is electrically connected to the auxiliary electrode. At least one luminescent region is provided.

The insulating layer covers the auxiliary electrode and the multiple tree-shaped transparent electrodes. In each luminescent region, the insulating layer is provided with multiple aperture regions. The multiple aperture regions are disposed at positions corresponding to the plurality of tree-shaped transparent electrodes.

The anti-short-circuit electrode layer is disposed on the insulating layer.

A second electrode layer is disposed opposite to the anti-short-circuit electrode layer.

The organic functional layer is disposed between the anti-short-circuit electrode layer and the second electrode layer.

REFERENCE LIST

Figure 1:
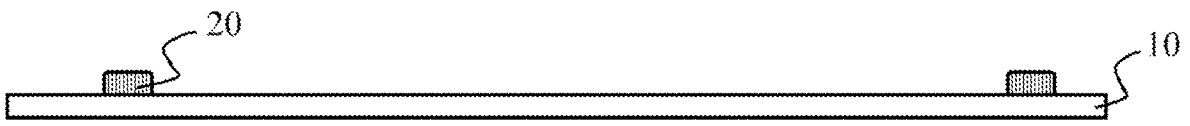
FIG. 1 is a diagram illustrating a structure in which an auxiliary electrode layer is prepared on a substrate according to example one of the present application.

10 substrate
20 auxiliary electrode
30 tree-shaped transparent electrode
30-1 trunk portion
30-2 branch portion
31 connection point
40 insulating layer
41 aperture region
50 anti-short-circuit electrode layer
51 first anti-short-circuit electrode layer
52 second anti-short-circuit electrode layer
70 second electrode layer
80 organic functional layer
81 micro-partition
90 first electrode layer
110 horizontal resistance
120 longitudinal anti-short-circuit layer

DETAILED DESCRIPTION

The present application is further described in detail in conjunction with drawings and embodiments. It is to be understood that the embodiments described herein are intended to illustrate and not to limit the present disclosure. It is to be noted that to facilitate description, only part of structures related to the present disclosure are illustrated in the drawings.

It is to be noted that if not in collision, the embodiments and features therein in the present application can be combined with each other. The present application is described hereinafter in detail with reference to the drawings and in conjunction with the embodiments.

Example One

With reference to FIGS. 1 to 6, this embodiment provides an organic electroluminescent device. The organic electroluminescent device includes a substrate 10, an auxiliary electrode 20, multiple tree-shaped transparent electrodes 30, an insulating layer 40, an anti-short-circuit electrode layer 50, a second electrode layer 70, and an organic functional layer 80.

The auxiliary electrode 20 is disposed on the substrate 10.

The multiple tree-shaped transparent electrodes 30 are disposed on the substrate 10. Each tree-shaped transparent electrode 30 is disposed at a position corresponding to a luminescent region of the organic electroluminescent device and is electrically connected to the auxiliary electrode 20.

The insulating layer 40 covers the auxiliary electrode 20 and the tree-shaped transparent electrodes 30. In each luminescent region, the insulating layer 40 is provided with multiple aperture regions 41, and the aperture regions 41 are disposed at positions corresponding to the tree-shaped transparent electrodes 30.

The anti-short-circuit electrode layer 50 is disposed on the insulating layer 40.

The second electrode layer 70 is disposed opposite to the anti-short-circuit electrode layer 50.

The organic functional layer 80 is disposed between the anti-short-circuit electrode layer 50 and the second electrode layer 80.

Figure 2A:
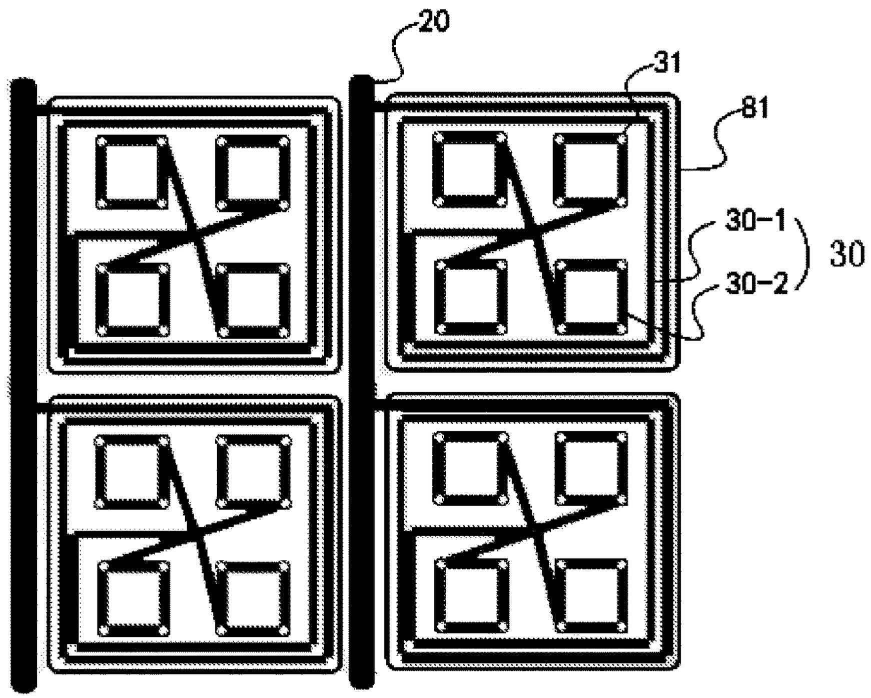
FIG. 2A is a top view of a structure in which an auxiliary electrode and tree-shaped transparent electrodes are prepared on a substrate according to example one of the present application.

The luminescent region refers to a region of the screen other than the non-luminescent portion. The luminescent region may be a whole continuous region or may be composed of multiple micro-partitions 81 as shown in FIG. 2A.

The "tree-shaped" of the tree-shaped transparent electrode 30 in this embodiment means that the electrode 30 has a trunk portion 30-1 and a branch portion 30-2 extending from the trunk portion. For example, as shown in FIG. 2A, the trunk portion 30-1 of the tree-shaped transparent electrode 30, after electrically connected to the auxiliary electrode 20, goes around a circle and a half in the region corresponding to the micro-partition 81. Then the trunk portion 30-1 goes to the center of the micro-partition 81 and branches out four branch portions 30-2.

The anti-short-circuit electrode layer 50 is equivalent to the first electrode of an OLED device in the related art, except that the anti-short-circuit electrode layer has specific relatively high longitudinal and horizontal resistance values. In the related art, when the second electrode is in direct contact with the first electrode, a short circuit defect may occur. Alternatively, when the thickness of the organic functional layer between the first electrode and the second electrode is reduced or deformed or is similarly abnormal, which causes loss of function of the organic functional layer, the short circuit defect may also occur. When the short circuit defect occurs, the leakage current is infinitely increased, the device current leaks through the short circuit defect, and only a small portion of the current of the luminescent device may flow avoiding the defect-free region. In this manner, the luminescent output of the luminescent device is reduced, and in many cases, the luminescent device may not work. In addition, when the currents dispersedly flowing to a large-area organic material flows concentratedly to the position where the short circuit occurs, high heat is locally generated, resulting in a device cracking or a fire risk.

However, in the luminescent device provided by this embodiment according to the present application, when a short circuit defect occurs, that is, when the second electrode is in contact with the anti-short-circuit electrode layer, the anti-short-circuit electrode layer has relatively high horizontal and longitudinal resistance values so that even if a short circuit occurs in the vertical direction, the horizontal direction may also limit the current from being too large. In addition, the transparent electrode layer has a tree-like design having a high longitudinal resistance value so that the amount of leakage current can be controlled and the leakage current does not increase infinitely. Therefore, the luminescent device may continue to work normally. For another example, when a short circuit defect occurs, the anti-short-circuit electrode layer has defect particles. At this time, the current flowing through the defect also needs to continue to flow through the tree-shaped transparent electrode layer with a high longitudinal resistance value. In this manner, the magnitude of the leakage current is controlled.

For example, both the anti-short-circuit electrode layer and the tree-shaped transparent electrode have a high resistance value. When a short-circuit defect occurs, the two may work at the same time, or only the tree-shaped transparent electrode work, so that the effect of preventing current from escaping from the short-circuit defect region is achieved by moderately increasing the resistance.

When the luminescent device is of a less-partition type or a small-pixel type, the ratio of the current of a single pixel or partition to the total current of the device is relatively high. When a short circuit defect occurs, if a longitudinal resistance scheme is adopted, the series resistance of a single pixel needs to be very high. Generally, the series resistance value satisfying the aperture ratio cannot prevent short circuits. Even if short circuits are prevented, due to the high proportion of the lost current, a slight dark spot or a black spot occurs in the entire screen. If the blowing scheme is adopted, the required blown current also needs to be very high, which is generally difficult to achieve. Therefore, blowing cannot be performed. Even if the blowing is performed, the ratio of the leakage current to the total current is higher. As a result, the brightness of the entire screen is significantly reduced, and a slight dark spot or a black spot may also occur.

However, in the luminescent device provided by this embodiment according to the present application, when a short circuit defect occurs, an ultra-large resistance value is formed between the anti-short-circuit electrode layer and the tree-shaped transparent electrode layer that are in series so that when the luminescent device is of the less-partition type or the small-pixel type, the resistance value requirement for anti-short-circuits can be easily met. Therefore, this luminescent device is well applicable to an OLED device of the less-partition type or the small-pixel type.

For example, the tandem effect of the short circuit electrode layer and the tree-shaped transparent electrode achieves a high resistance value for anti-short-circuits. In this manner, the technical scheme of the present application is applicable to a screen of the less-partition type or the small-pixel type.

For example, the preceding luminescent device is prepared as follows;

As shown in FIG. 1, the auxiliary electrode 20 is photo-etched on the substrate 10. In this embodiment, the substrate 10 is transparent glass. The auxiliary electrode 20 is a metal electrode and is in the shape of a mesh, an arborization, or a blood vessel. The auxiliary electrode mesh is made of a metal with a surface resistance between 0.01 $\Omega/mm^2$ and 1 $\Omega/mm^2$. The metal may be, for example, titanium aluminum titanium (TiAlTi), aluminum titanium (AlTi), chromium (Cr), silver (Ag), or molybdenum aluminum molybdenum (MoAlMo). Materials such as a highly conductive nanometer silver wire and a carbon nanotube may also be selected. The auxiliary electrode distribution of mesh-like, arborization-like or blood-vessel-like in the present application can play the role of equalizing current, improving the luminescence uniformity.

Figure 3:
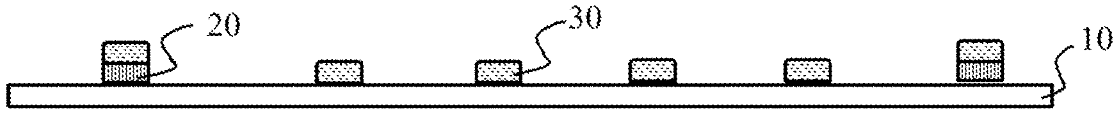
FIG. 3 is a section view of a structure in which an auxiliary electrode and tree-shaped transparent electrodes are prepared on a substrate according to example one of the present application.

As shown in FIGS. 2A and 3, the tree-shaped transparent electrode 30 is formed on the substrate 10. A transparent material, such as ITO or aluminum-doped zinc oxide (AZO), with a surface resistance between 0.5 $\Omega/mm^2$ and 100 $\Omega/mm^2$ is adopted to make the tree-shaped transparent electrode 30. The tree-shaped transparent electrode 30 is disposed at the position corresponding to the luminescent region of the luminescent device. Most of the wiring of the tree-shaped transparent electrodes 30 is located in the micro-partitions 81. The presence of the tree-shaped transparent electrodes 30 does not affect the luminescent region and aperture ratio of the OLED. The tree-shaped transparent electrode layer may be a dispersed dendritic structure for equalizing surface current distribution. The trunk portion 30-1 of the layer is connected to the auxiliary electrode, and the branch portion connects several uniformly-distributed connection points 31. The current can only be uniformly distributed to the arranged connection points 31 through the tree-shaped transparent electrode 30. Moreover, the resistance from each connection point 31 to the auxiliary electrode is the same, so the layer plays the role of series resistance and uniformly distributing current. Moreover, the aperture ratio of the device is not affected so that the aperture ratio of the device is close to 100%. The resistance value from the end of the branch portion to the connection end is in the range of 500Ω to 10000Ω, for example, 1000Ω to 7000Ω.

Figure 2B:
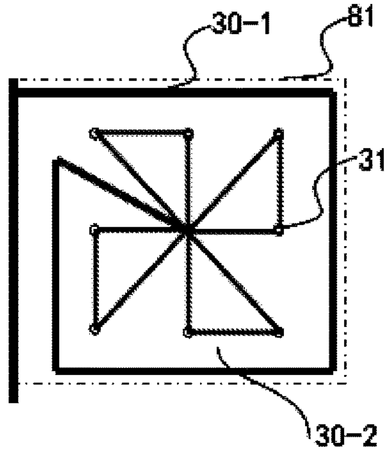
FIG. 2B is a diagram illustrating the structure of the tree-shaped transparent electrode in another implementation according to example one of the present application.

The wire wrapping method of the branch portion 30-2 of the tree-shaped transparent electrode 30 is a grid pattern as shown in FIG. 2A or may be a triangular connection as shown in FIG. 2B.

Figure 4:
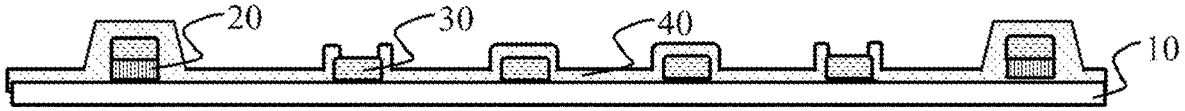
FIG. 4 is a section view of a structure having an insulating layer according to example one of the present application.

As shown in FIG. 4, the insulating layer 40 is covered on the auxiliary electrode mesh 20 and the tree-shaped transparent electrodes 30, and an appropriate area of the tree-shaped transparent electrode 30 is exposed as a current wire. The insulating layer 40 is provided with an aperture region 41. As shown in FIGS. 2A and 2B, the tree-shaped transparent electrode 30 is provided with a current connection point 31. The current connection point 31 is disposed at the position corresponding to the aperture region 41. The aperture region 41 is used to overlap the tree-shaped transparent electrode 30 and the subsequent anti-short-circuit electrode layer 50. The insulating layer 40 may be made of an inorganic or organic material, such as inorganic silicon oxide or silicon nitride.

Figure 5:
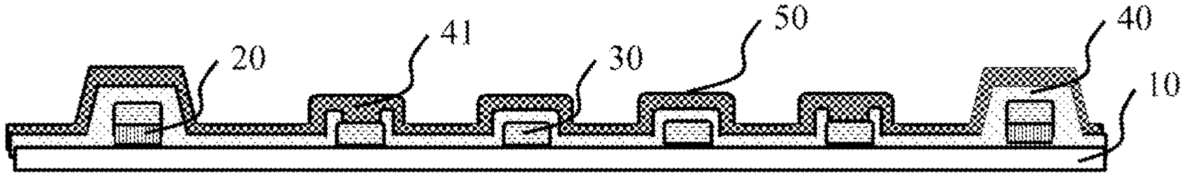
FIG. 5 is a section view of a structure having an anti-short-circuit electrode layer according to example one of the present application.

As shown in FIG. 5, the anti-short-circuit electrode layer 50 is prepared on the insulating layer 40 by sputtering or evaporation of an electrode layer. The anti-short-circuit electrode layer 50 may be a full-surface communication design. Alternatively, an OLED surface electrode layer (for example, anode) may be designed in a partitioned manner on the anti-short-circuit electrode layer 50. This layer has certain longitudinal and horizontal resistance values and has a higher conductivity than OLED materials. Moreover, this layer has the function of a surface-resistance protection layer.

The anti-short-circuit electrode layer may be arranged in a single layer or may be layered. When arranged in the single layer, the anti-short-circuit electrode layer may be formed in the following manners:

1. The anti-short-circuit electrode layer may be made of a mixture of an inorganic conductive material and an inorganic insulating material. The inorganic conductive material may be, for example, indium oxide and tin oxide. The inorganic insulating material may be, for example, silicon oxide. After being mixed, the three materials are sputtered onto the corresponding film made of the insulating material to obtain the anti-short-circuit electrode layer. The surface resistance of the anti-short-circuit electrode layer may be adjusted to a suitable value by the adjustment of the film thickness and the proportions of indium oxide, tin oxide, and silicon oxide.

2. The anti-short-circuit electrode layer may be made of a mixture of an inorganic conductive material and an organic insulating material. The inorganic conductive material may be, for example, a carbon nanowire or a silver nanowire. The organic insulating material is, for example, an organic glue. The inorganic conductive material and the organic insulating material form a mixed film.
3. The anti-short-circuit electrode layer is directly made of an organic conductive material, such as a PEDOT-like polymeric conductive material. PEDOT is a polymer of EDOT (3, 4-ethylenedioxythiophene), namely, poly(3, 4-ethylenedioxythiophene).

The surface resistance of the anti-short-circuit electrode layer described in this embodiment is in the range of 100 $\Omega/mm^2$ to 2500 $\Omega/mm^2$, for example, 500 $\Omega/mm^2$ to 2000$\Omega/mm^2$.

Figure 6:
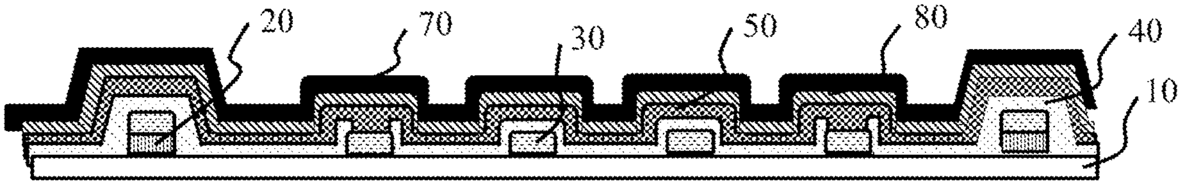
FIG. 6 is a section view of a structure having an organic functional layer and a second electrode layer according to example one of the present application.

As shown in FIG. 6, the organic functional layer 80 and the second electrode layer 70 are the last to be evaporated.

In the luminescent device of this embodiment, the luminescent region is divided into multiple micro-partitions 81. Each micro-partition has an area of 10000 $\mu m^2$ to 1000000 $\mu m^2$. For example, the area may be in the range of 40000 $\mu m^2$ to 160000 $\mu m^2$. In this example size, when the distance between human eyes and the luminescent surface is greater than 30 cm, a single partition defect, even if present, is not apparent from visual observation.

The shape of the luminescent region in this embodiment is a polygon, a circle, or an irregular shape. The shape of those micro-partitions may be triangle, quadrilateral, hexagon, or the like.

In this embodiment, the refractive index of the anti-short-circuit electrode layer is greater than 1.5 to reduce the total internal reflection from the organic functional layer to the anti-short-circuit electrode layer.

In other embodiments, the following methods may be selected or adopted simultaneously:

The surface of the anti-short-circuit electrode layer is provided with undulating micro-structures; or the anti-short-circuit electrode layer is doped with a scattered particle.

Each of the preceding methods can reduce the total internal reflection of the interface between the functional layer and the anti-short-circuit electrode layer to promote light extraction.

Example Two

Figure 7:
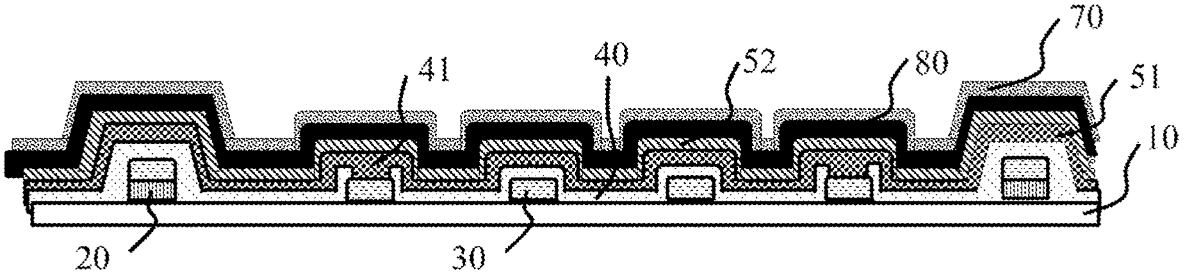
FIG. 7 is a section view of a structure according to example two of the present application.

On the basis of example one, as shown in FIG. 7, the anti-short-circuit electrode layer 50 in this embodiment is arranged in a layered manner. In this example, the anti-short-circuit electrode layer 50 includes a first anti-short-circuit electrode layer 51 adjacent to the insulating layer 40 and a second anti-short-circuit electrode layer 52 located on the first anti-short-circuit electrode layer 51. The surface resistance of the first anti-short-circuit electrode layer 51 is in the range of 100 $\Omega/mm^2$ to 2500 $\Omega/mm^2$, for example, 500 $\Omega/mm^2$ to 2000 $\Omega/mm^2$. The second anti-short-circuit electrode layer 52 has poor horizontal conductivity and a surface resistance greater than 10000 $\Omega/mm^2$. The second anti-short-circuit electrode layer 52 is mainly used to modify the surface of the electrode and promote the effective injection of charges. The longitudinal resistance value of the second anti-short-circuit electrode layer 52 corresponding to the area of 1 mm*1 mm is in the range of 1000Ω to 10000Ω, for example, 2000Ω to 3000Ω.

The first anti-short-circuit electrode layer may be a transparent anode of the screen or may be a transparent cathode of the screen.

The first anti-short-circuit electrode layer 51 has relatively good conductivity and may distribute the current derived from the tree-shaped transparent electrode.

The first anti-short-circuit electrode layer 51 may be made in the following manners:

1. The anti-short-circuit electrode layer may be made of a mixture of an inorganic conductive material and an inorganic insulating material. The inorganic conductive material may be, for example, indium oxide and tin oxide. The inorganic insulating material may be, for example, silicon oxide. After being mixed, the three materials are sputtered onto the corresponding film made of the insulating material to obtain the anti-short-circuit electrode layer. The conductivity of the anti-short-circuit electrode layer may be adjusted to a suitable value by the adjustment of the proportions of indium oxide, tin oxide, and silicon oxide.
2. The anti-short-circuit electrode layer may be made of a mixture of an inorganic conductive material and an organic insulating material. The inorganic conductive material may be, for example, a carbon nanowire or a silver nanowire. The organic insulating material may be, for example, an organic glue. The preceding inorganic conductive material and the organic insulating material form a mixed film.
3. The anti-short-circuit electrode layer is directly made of an organic conductive material, such as a PEDOT-like polymeric conductive material. PEDOT is a polymer of EDOT (3, 4-ethylenedioxythiophene).

The second anti-short-circuit electrode layer 52 has a relatively large longitudinal resistance and a proper work function.

The layered arrangement can better regulate the horizontal resistance value and the work function of the interface. The OLED functional layer is better matched. The longitudinal resistance value of the second anti-short-circuit electrode layer 52 corresponding to the area of 1 $mm^2$ is in the range of 1000Ω to 10000Ω, for example, 2000Ω to 3000Ω. The second anti-short-circuit electrode layer is made of a metal oxide (for example, tungsten oxide and molybdenum oxide) or an organic polymer (for example, high-resistance PEDOT).

Example Three

On the basis of example one, the anti-short-circuit electrode layer 50 in this embodiment is arranged to correspond to each luminescent region 81 in a partitioned manner.

In this embodiment, the anti-short-circuit layer is not the entire surface covering the entire luminescent region of the screen, but an independent anti-short-circuit layer formed by being disconnected at the edge of each luminescent region 81. This configuration further reduces the influence of current flows among pixels and the risk of current flowing from adjacent luminescent regions 81 to defective partitions. Since the gap between the luminescent regions 81 is a non-luminescent region, the aperture ratio is reduced to a certain extent.

The following are comparative experiments:

Comparative Example One

Figure 8A:
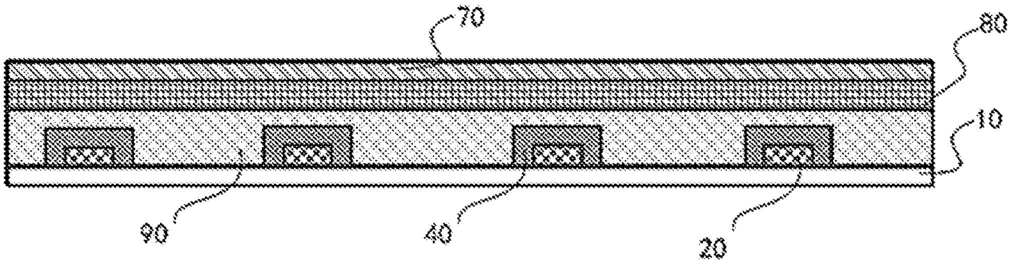
FIG. 8A is a section view of a structure according to comparative example one of the present application.

As shown in FIG. 8A, in this comparative example, a luminescent device is provided with a substrate 10, a first electrode layer 90, an auxiliary electrode 20, an insulating layer 40, an organic functional layer 80, a second electrode layer 70, and an encapsulation layer (not shown). The number of samples of the luminescent screen of the luminescent device is 1000. The luminescent region of each luminescent screen is 100 mm*100 mm. An anti-short-circuit structure is not provided.

The first electrode layer 90 is an anode made of ITO. The auxiliary electrode 20 is a metal mesh. The organic functional layer sequentially includes a hole transport layer formed by evaporation of N,N' bis(naphthalen 1 yl) N,N' bi s(phenyl) benzidine (NPB) of 81 nm, a luminescent layer formed by evaporation of 9, 10 di(2 naphthy)anthracene (AND): 10-2-(benzothiazolyl)-2,3,6,7-tetrahydro-1,1,7,7-tetramethyl-1H, 5H, 11H-(1)benzopyropyrano (6,7,-8-ij) quinolizin-11-one (C545T) 2% of 30 nm, an electron transport layer formed by evaporation of tris(8-hydroxyquinolinato)aluminum (Alq3) of 20 nm, and an electron injection layer formed by evaporation of LiF of 0.5 nm. The second electrode layer forms the cathode by evaporation of Al of 181 nm. Excluding the metal mesh, the effective luminescent region accounts for 98% of the partition area.

Comparative Example Two

Figure 8B:
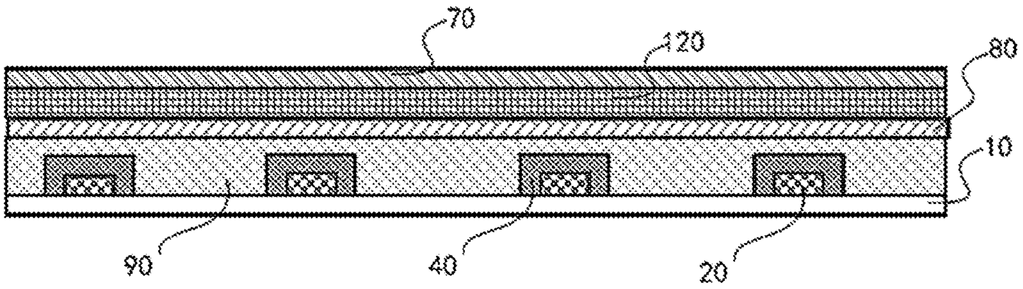
FIG. 8B is a section view of a structure according to comparative example two of the present application.

As shown in FIG. 8B, comparative example two differs from comparative example one in that molybdenum oxide of 30 nm is evaporated between the first electrode layer 90 and the organic functional layer 80 to serve as the longitudinal anti-short-circuit layer 120. The luminescent size of the screen is 100 mm*100 mm, and the number of samples taken is 1000.

Comparative Example Three

Figure 9:
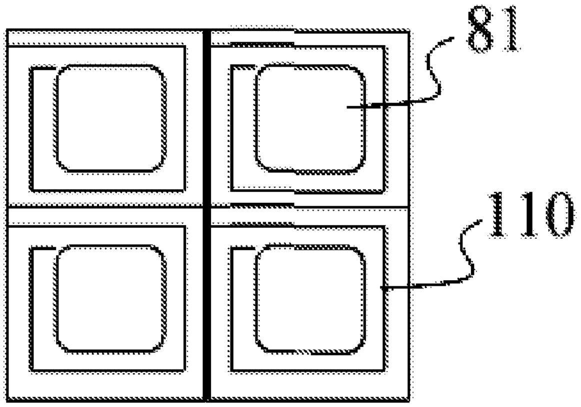
FIG. 9 is a top view illustrating a structure according to comparative example three of the present application.

As shown in FIG. 9, comparative example three differs from comparative example one in that the luminescent region is partitioned. The area of a single micro-partition 81 is 500 μm*500 μm. A horizontal resistance 110 about 2000Ω is arranged in each micro-partition. The number of samples is 1000.

Comparative Example Four

Compared with that in comparative example three, the luminescent region of the screen is reduced to 10*10 $mm^2$. To count the luminescent defects proportion of the same area, 1000000 samples are selected. The area of the luminescent region on each screen is still 500 μm*500 μm. 400 micro-partitions are provided on each screen.

Experimental Example One

This example adopts the device structure of example one. In other words, the luminescent device is provided with the substrate 10, the auxiliary electrode 20, the tree-shaped transparent electrode 30*s*, the insulating layer 40, the anti-short-circuit electrode layer 50, the organic functional layer 80, the second electrode layer 70, and the encapsulation layer. The average line width of the tree-shaped transparent electrodes is 10 μm. The overall wire wrapping resistance is 3000Ω. The insulating layer 40 is made of the silicon oxide material. The luminescent region of each luminescent region is 100 mm*100 mm.

The anti-short-circuit electrode layer is a whole-layer design and is not partitioned.

In this example, the tree-shaped transparent electrode 30 has a distribution structure shown in FIG. 2A. The area corresponding to each transparent electrode branch is 500 μm*500 μm.

The parameters of the organic functional layer are the same as those in comparative example one. Excluding the metal mesh, the effective luminescent region accounts for 98% of the partition area. The number of samples is 1000.

Experimental Example Two

This example differs from experimental example one in that the luminescent region of each luminescent region is 10 mm*10 mm and the number of samples is 1000000.

Experimental Example Three

This example differs from experimental example one in that the anti-short-circuit electrode layer is divided into micro-partitions, and each of the micro-partitions has an area of 500 μm*500 μm. The gap width between two adjacent partitions is 10 μm. Compared with that in experimental example one, the effective luminescent region is reduced by about 4%.

Experimental Example Four

This example differs from experimental example one in that the anti-short-circuit layer 50 is divided into two layers of the first anti-short-circuit layer 51 and the second anti-short-circuit layer 52. The surface resistance of the first anti-short-circuit layer 51 is 1500 Ω/$mm^2$. The second anti-short-circuit layer 52 is a tungsten oxide layer, and its vertical resistance corresponding to 1 $mm^2$ is 1500Ω. In this example, the tree-shaped transparent electrode 30 has the distribution structure shown in FIG. 2A. The area corresponding to each transparent electrode branch is 500 μm*500 μm.

A comparison chart of multiple device parameters is shown below.

| Project | Number of Luminescent Screens | Luminescent region of Luminescent Screen | Number of Micro-partitions per Screen | Anti-short-circuit Structure |
|---|---|---|---|---|
| Comparative Example One | 1000 | 100 mm*100 mm | 1 | none |
| Comparative Example Two | 1000 | 100 mm*100 mm | 1 | longitudinal anti-short-circuit structure |
| Comparative Example Three | 1000 | 100 mm*100 mm | 40000 | horizontal resistance |

-continued

| Project | Number of Luminescent Screens | Luminescent region of Luminescent Screen | Number of Micro-partitions per Screen | Anti-short-circuit Structure |
|---|---|---|---|---|
| Comparative Example Four | 1000000 | 10 mm*10 mm | 400 | horizontal resistance |
| Experimental Example One | 1000 | 100 mm*100 mm | 40000 | tree-shaped transparent electrode plus anti-short-circuit electrode layer |
| Experimental Example Two | 1000000 | 10 mm*10 mm | 400 | tree-shaped transparent electrode plus anti-short-circuit electrode layer |
| Experimental Example Three | 1000 | 100 mm*100 mm | 40000 | tree-shaped transparent electrode plus partitioned anti-short-circuit electrode layer |
| Experimental Example Four | 1000 | 100 mm*100 mm | 40000 | tree-shaped transparent electrode plus layered anti-short-circuit electrode layer |

The performance of multiple devices is as follows:

| Project | Point Defect Ratio | Voltage V | Current Efficiency cd/A | Lifetime T70 | Aperture Ratio | Brightness cd/m2 | Other Phenomena |
|---|---|---|---|---|---|---|---|
| Comparative Example One | 17% | 3.7 | 9.8 | \ | 98% | 1001 | 17% point defect, 5% whole-screen short circuit failure |
| Comparative Example Two | 8% | 3.6 | 9.7 | \ | 98% | 1005 | 8% point defect, 3% whole-screen short circuit failure |
| Comparative Example Three | 5% | 3.9 | 9.7 | \ | 81% | 998 | 3% point defect, surrounding pixels darkened, 1% whole-screen short circuit failure |
| Comparative Example Four | 3% | 3.6 | 9.8 | 2400 h | 81% | 1003 | 2% point defect, brightness of defective screens dropping significantly and failing |
| Experimental Example One | 2% | 3.7 | 9.7 | \ | 98% | 1001 | 1.5% point defect, no darkening in the surrounding, 0.4% whole-screen failure |
| Experimental Example Two | <1% | 3.6 | 9.6 | 3100 h | 98% | 1003 | 1% point defect, no obvious brightness dropping, 0.3% whole-screen failure |
| Experimental Example Three | <2% | 3.6 | 9.7 | 2600 h | 94% | 995 | 1.5% point defect, 0.4% whole-screen failure |
| Experimental Example Four | <2% | 3.3 | 9.7 | 3100 h | 98% | 998 | 1.5% point defect, 0.4% whole-screen failure |

The point defect ratio in the preceding comparison results means that the number of screens with point defects is divided by the total sample number. The screen short circuit failure means that a local short circuit causes the brightness of the screen to drop significantly or darken locally, and obvious regional defects are observed from the appearance.

From the comparison of the point defect ratio, comparative example one, due to the absence of the anti-short-circuit structure, has the highest point defect ratio and a high ratio of the whole-screen failure.

In comparative example two, since the longitudinal anti-short-circuit layer is provided, defects can be prevented to a certain extent. However, since the anti-short-circuit layer is relatively thin, particle defects that exist before evaporation cannot be effectively covered. Thus a certain proportion of whole-screen failure exists.

In comparative example three, since the horizontal resistance is provided, defects can be prevented to a certain extent, and under the same conditions, the effect of the horizontal resistance is better than that of the longitudinal anti-short-circuit layer in comparative example two. However, the aperture ratio of this scheme is relatively low, the brightness of the device decreases, and the service life of the device is relatively reduced when the device corresponds to a higher initial brightness. In addition, if a short circuit defect occurs, although the current-limiting resistance exists, current in the short-circuit region may still be distributed to the nearby partitions, causing the pixels to be darkened. The addition of a fuse with a large resistance may cause the voltage to rise.

Based on comparative example three, the number of luminescent screens in comparative example four is increased to 10000 and the luminescent region is reduced to $10*10\ mm^2$. In this manner, the point defect ratio is further reduced. In comparative example four, however, when a short circuit failure occurs, the screen brightness is greatly reduced, and screens with point defects are usually shown as a whole-screen failure. This scheme shows that the resistance scheme is adopted in a small-area screen, if a short circuit occurs, although the current-limiting resistance exists, the overall current of the screen drops because a large proportion of the current of the whole screen is lost ineffectively at the short circuit position. Therefore, the structure is not applicable to the small-area luminescent screen.

In experimental example one and experimental example two, however, the point defect ratio is better than any of the preceding comparative examples due to the configuration of the anti-short-circuit electrode layer and the tree-shaped transparent electrode. In particular, as shown in experimental example two, when the technical scheme of the present application is applied to a screen with a small independent luminescent region, the point defect rate is significantly reduced, and no large decrease in the brightness of the entire screen due to a current loss exists, which represents that even when applied to a small number of luminescent region screens, the structure of the present application has a better anti-short-circuit effect than the existing screens having a simple series resistance.

Experimental example three adopts a partitioned large-resistance anti-short-circuit design, resulting in a reduced effective luminescent region. However, compared with comparative example three, the aperture ratio is still larger. In comparison, the lifetime is longer.

Experimental example four adopts a layered design for the large-resistance layer. The second layer of tungsten oxide effectively promotes charge injection and reduces the working voltage of the screen.

Therefore, in the technical scheme of the present application, the area of the micro-luminescent region is in the range of 100 μm*100 μm to 1000 μm*1000 μm. The shape of the micro-luminescent region may be a square, a triangle, a hexagon, a circle, an irregular shape, or the like. Because when the area of the micro-luminescent region is too small, the lead wire ratio of the auxiliary electrode is large, and a failing point leads to an obvious defect. However, when the area of the micro-luminescent region is in the range of 200 μm*200 μm to 400 μm*400 μm, and when the distance between human eyes and the screen is greater than 30 cm, a single micro-partition failure, even if present, is not easily observed, and the defects in appearance of the entire screen is not obvious.

In addition, based on the results of the preceding comparative experiments, it can also be seen that:

1. Lifetime T70 denotes the time for the screen brightness decaying to 70% of the initial brightness. As can be seen from the preceding comparative experiments, the technical scheme of the present application also significantly improves the service life of the screen.
2. The technical scheme of the present application has a very high aperture ratio while ensuring excellent anti-short-circuit performance.

In the preceding technical scheme of the present application, the tree-shaped transparent electrode disposed at the position corresponding to the luminescent region of the device and the anti-short-circuit electrode layer covering the auxiliary electrode and the tree-shaped transparent electrodes are provided. In this manner, when a short circuit occurs, the current flows through the anti-short-circuit electrode layer, the tree-shaped transparent electrode, and then to the auxiliary electrode. The anti-short-circuit electrode layer and the tree-shaped transparent electrode play the role of double anti-short-circuit protection. When particle defects exist on the anti-short-circuit electrode layer or the tree-shaped transparent electrode, the short circuit can be prevented by the large resistance formed by the tree-shaped transparent electrode.

The tree-shaped transparent electrodes are disposed to correspond to the luminescent region, which does not affect the luminescent region and the aperture ratio of the organic electroluminescent device. In this manner, the defect that the aperture ratio is large in the longitudinal resistance scheme of the related art can be perfectly avoided. Moreover, the tree-shaped transparent electrode can equalize the current distribution so that the luminescence uniformity of the luminescent device can be improved.

What is claimed is:

1. An organic electroluminescent device, comprising:

a substrate;

an auxiliary electrode disposed on the substrate;

a plurality of tree-shaped transparent electrodes disposed on the substrate, wherein each of the plurality of tree-shaped transparent electrodes comprises a trunk portion and a branch portion branched from the trunk portion, wherein the trunk portion has a connection end connected to the auxiliary electrode;

each of the plurality of tree-shaped transparent electrodes is disposed at a position corresponding to a luminescent region of the organic electroluminescent device and is electrically connected to the auxiliary electrode, wherein at least one luminescent region is provided;

an insulating layer covering the auxiliary electrode and the plurality of tree-shaped transparent electrodes, wherein in each luminescent region of the at least one luminescent region, the insulating layer is provided with a plurality of aperture regions, wherein an aperture region of the plurality of aperture regions is disposed at a position corresponding to a tree-shaped transparent electrode of the plurality of tree-shaped transparent electrodes;

an anti-short-circuit electrode layer disposed on the insulating layer;

a second electrode layer disposed opposite to the anti-short-circuit electrode layer; and an organic functional layer disposed between the anti-short-circuit electrode layer and the second electrode layer.

2. The organic electroluminescent device according to claim 1, wherein the anti-short-circuit electrode layer is made of a mixture of an inorganic conductive material and an insulating material or is made of an organic conductive material, and a surface resistance of the anti-short-circuit electrode layer is in a range of 100 2/mm$^2$ to 2500 Ω/mm$^2$.

3. The organic electroluminescent device according to claim 2, wherein the surface resistance of the anti-short-circuit electrode layer is in a range of 500 Ω/mm$^2$ to 2000 Ω/mm$^2$.

4. The organic electroluminescent device according to claim 2, wherein the anti-short-circuit electrode layer comprises a first anti-short-circuit electrode layer adjacent to the insulating layer and a second anti-short-circuit electrode layer located on the first anti-short-circuit electrode layer, wherein a surface resistance of the first anti-short-circuit electrode layer is in a range of 100 Ω/mm$^2$ to 2500 Ω/mm$^2$, and a longitudinal resistance value of the second anti-short-circuit electrode layer corresponding to an area of 1 mm*1 mm is in a range of 1000Ω to 10000Ω.

5. The organic electroluminescent device according to claim 4, wherein the surface resistance of the first anti-short-circuit electrode layer is in a range of 500 Ω/mm$^2$ to 2000 Q/mm$^2$, and the longitudinal resistance value of the second anti-short-circuit electrode layer corresponding to the area of 1 mm*1 mm is in a range of 2000Ω to 3000Ω.

6. The organic electroluminescent device according to claim 4, wherein the first anti-short-circuit electrode layer is made of the mixture of the inorganic conductive material and the insulating material or is made of the organic conductive material, and the second anti-short-circuit electrode layer is made of a metal oxide or an organic polymer.

7. The organic electroluminescent device according to claim 1, wherein a resistance value from an end of the branch portion to the connection end is in a range of 500Ω to 10000Ω.

8. The organic electroluminescent device according to claim 7, wherein the resistance value from the end of the branch portion to the connection end is in a range of 1000 £2 to 7000Ω.

9. The organic electroluminescent device according to claim 7, wherein a luminescent region of the at least one luminescent region is composed of a plurality of micro-partitions, wherein each of the plurality of micro-partitions has an area of 10000 μm$^2$ to 1000000 μm$^2$.

10. The organic electroluminescent device according to claim 9, wherein each of the plurality of micro-partitions has an area of 40000 μm$^2$ to 160000 μm$^2$.

11. The organic electroluminescent device according to claim 9, wherein the anti-short-circuit electrode layer is disposed at a position corresponding to each of the plurality of micro-partitions.

12. The organic electroluminescent device according to claim 11, wherein a shape of the luminescent region is a polygon, a circle, or an irregular shape, and each of the plurality of micro-partitions is quadrilateral, triangle, or hexagon.

13. The organic electroluminescent device according to claim 1, wherein the anti-short-circuit electrode layer satisfies at least one of the following conditions:

a refractive index of the anti-short-circuit electrode layer is greater than 1.5;

a surface of the anti-short-circuit electrode layer is provided with undulating micro-structures; or the anti-short-circuit electrode layer is doped with a scattered particle.

14. The organic electroluminescent device according to claim 1, wherein a material of the auxiliary electrode layer is at least one of TiAlTi, AlTi, Cr, Ag, or MoAlMo.

15. The organic electroluminescent device according to claim 3, wherein the anti-short-circuit electrode layer comprises a first anti-short-circuit electrode layer adjacent to the insulating layer and a second anti-short-circuit electrode layer located on the first anti-short-circuit electrode layer, wherein a surface resistance of the first anti-short-circuit electrode layer is in a range of 100 Ω/mm$^2$ to 2500 Ω/mm$^2$, and a longitudinal resistance value of the second anti-short-circuit electrode layer corresponding to an area of 1 mm*1 mm is in a range of 1000Ω to 10000Ω.

16. The organic electroluminescent device according to claim 5, wherein the first anti-short-circuit electrode layer is made of the mixture of the inorganic conductive material and the insulating material or is made of the organic conductive material, and the second anti-short-circuit electrode layer is made of a metal oxide or an organic polymer.

17. The organic electroluminescent device according to claim 2, wherein the tree-shaped transparent electrode comprises a trunk portion and a branch portion branched from the trunk portion, wherein the trunk portion has a connection end connected to the auxiliary electrode, and a resistance value from an end of the branch portion to the connection end is in a range of 500Ω to 10000Ω.

18. The organic electroluminescent device according to claim 3, wherein the tree-shaped transparent electrode comprises a trunk portion and a branch portion branched from the trunk portion, wherein the trunk portion has a connection end connected to the auxiliary electrode, and a resistance value from an end of the branch portion to the connection end is in a range of 500Ω to 10000Ω.

19. The organic electroluminescent device according to claim 4, wherein the tree-shaped transparent electrode comprises a trunk portion and a branch portion branched from the trunk portion, wherein the trunk portion has a connection end connected to the auxiliary electrode, and a resistance value from an end of the branch portion to the connection end is in a range of 500Ω to 10000Ω.

20. The organic electroluminescent device according to claim 5, wherein the tree-shaped transparent electrode comprises a trunk portion and a branch portion branched from the trunk portion, wherein the trunk portion has a connection end connected to the auxiliary electrode, and a resistance value from an end of the branch portion to the connection end is in a range of 500Ω to 10000Ω.

* * * * *